OR 3,693,095

United States Patent [15] 3,693,095
Wilt X 343-703 [45] Sept. 19, 1972

[54] RADIOMETER GAIN CONTROL REFERENCE

[72] Inventor: Robert E. Wilt, Clearwater, Fla.

[73] Assignee: Sperry Rand Corporation

[22] Filed: Oct. 28, 1970

[21] Appl. No.: 84,677

[52] U.S. Cl. .................325/363, 250/210, 324/58 R, 331/78

[51] Int. Cl. .............................................G01r 29/08

[58] Field of Search .......324/58 A, 58 B, 58 C, 58 R, 324/62 B; 325/67, 363, 407; 331/78; 250/206, 210, 216, 83 R; 329/50; 338/216

[56] References Cited

UNITED STATES PATENTS

| | | | |
|---|---|---|---|
| 3,168,705 | 2/1965 | Okamara et al. | ........324/58 A |
| 3,506,915 | 4/1970 | Harris et al. | .................324/57 |
| 3,519,952 | 7/1970 | Buegel | .........................331/78 |
| 3,559,071 | 1/1971 | Mead et al. | ................325/363 |

*Primary Examiner*—Benedict V. Safourek
*Attorney*—S. C. Yeaton

[57] ABSTRACT

An improved high frequency radiometer features elimination of loss of its calibration due to undesired long-term gain changes through the addition of a quadrature modulation signal path in the radiometer receiver as a means of coupling a gain control reference signal into the radiometer receiver. The gain control reference signal is ultimately separated at the output of the radiometer receiver and provides a feed back signal to correct for undesired receiver gain changes. The gain control reference signal is generated by improved means permitting the cyclic modulation of the temperature of a heated fine wire element coupled to the radiometer receiver.

13 Claims, 6 Drawing Figures

INVENTOR
ROBERT E. WILT
BY
HP Terry
ATTORNEY

INVENTOR
ROBERT E. WILT
BY
HP Terry
ATTORNEY

RADIOMETER GAIN CONTROL REFERENCE

BACKGROUND OF THE INVENTION

1. Field of the Invention

The invention pertains to the art of microwave radiometry using comparison of the amplitude of a signal to be investigated, such as a thermal noise signal, to the amplitude of a locally generated reference signal. The invention more particularly relates to the use of a novel gain control reference generator system in an amplitude comparison radiometer receiver for the purpose of fixed control of the over all gain of the receiver, a reference generator operating by cyclic modulation of the temperature of a fine heated wire.

2. Description of the Prior Art

In the prior art, the comparison type of radiometer has been most widely used for the study of relatively low-level noise-like radio frequency signals, especially where the noise signals to be examined are small in comparison to the internally generated noise level within the radiometer receiver. Comparison radiometer systems achieve substantial cancellation of the receiver background noise and self-noise, permitting relatively accurate measurements of such low-level radio frequency signals.

While radiometers of the comparison type are much less affected by gain variations than are some other types, moderate over all gain variations in the receiver may still produce severe degradation of accuracy, since gain variation has a direct adverse effect on the output signal in any high sensitivity radiometer. Thus, changes in gain, such as those of long term nature caused by drift in power supply voltages, changes in ambient temperature, and aging of components, can seriously limit the usefulness of the radiometer.

Manual and automatic null-balance techniques commonly used in radiometer receivers are complex and somewhat expensive. The cost of the added elements required to practice the null-balance method, including a stable noise source and a precision attenuator for making manual null-balances, is relatively high. Furthermore, with the automatic null-balance method, the receiver output is usually non-linear, whereas the output voltage should remain a linear function of the temperature of the object viewed by the antenna.

Significant progress has been made in solving the gain instability problem in radiometers through the use of a quadrature modulation signal path through the radiometer receiver for precise and stable control of the over all gain of the radiometer system, as taught by Robert S. Roeder in patent application Ser. No. 1,497, filed Jan. 8, 1970, now U.S. Pat. No. 3,628,151, issued Dec. 14, 1971, entitled "Radiometer Gain Control", and assigned to the Sperry Rand Corporation. The arrangement permits economic use of a common path through a significant portion of the radiometer receiver without any interference with its processing of the signals intended to be processed for providing useful radiometric data.

However, there has been available in the prior art for use in such a quadrature gain control only those sources of controllable power level noise signals as have previously been used in radiometric systems to generate reference comparison signals at the input of the radiometer. Such prior art noise sources include temperature controlled transmission line terminations and noise generating semiconductor and other diodes, including avalanche diodes, temperature limited thermionic vacuum diodes, and gas discharge diode devices. Such prior devices suffer various disadvantages, such as large size and weight, high power-consumption, and excessive cost. Other such devices demonstrate instability in time and temperature, unsuitability for use at millimeter wave lengths, and fragility. Certain of the devices can produce an output changeable in amplitude only slowly or by only a small percentage.

SUMMARY OF THE INVENTION

The present invention is an improved radiometer providing means for detecting and measuring very weak electromagnetic signals, including electrical noise signals of the thermal noise level type and comprising relatively simple apparatus providing improved gain stability and therefore greatly improved calibration accuracy.

In the invention, improved gain control is effected by use of a quadrature modulation signal path as a means for passing a gain control reference signal through the radiometer receiver. The gain control reference signal is separated at the output of the receiver for the purpose of generating feed back signal for control of the over all gain of the radiometer receiver. The primary radiometer and the gain control signals have quadrature phase relation and therefore economically use a common path through a portion of the receiver. They perform their individual functions in an entirely compatible manner, the presence of the one such signal not interfering with the function of the other.

The quadrature modulation signal is generated by square wave modulation of a fine heated wire whose broad band electromagnetic noise energy spectrum is coupled into the path of the primary radiometer signals. Modulation is effected by causing a bridge circuit including the heated wire in one of its arms to become cyclically unbalanced in a square wave manner by operation of a light beam upon a photosensitive resistor inserted as a second element of the bridge.

The heated wire device is smaller than any prior art device except the semiconductor noise diode, whose output unpredictably varies with ambient temperature. Further, the heated wire device consumes much less power than is consumed in the controlled heating of transmission line terminations. The heated wire device is useful at frequencies far higher than the useful range of the vacuum diode. The gas discharge tube suffers in comparison because of its size, high voltage, and high current requirements. The heated wire device of the present invention is superior in one or more respects to all prior art devices.

DESCRIPTION OF THE PREFERRED EMBODIMENT

Figures 1, 2:
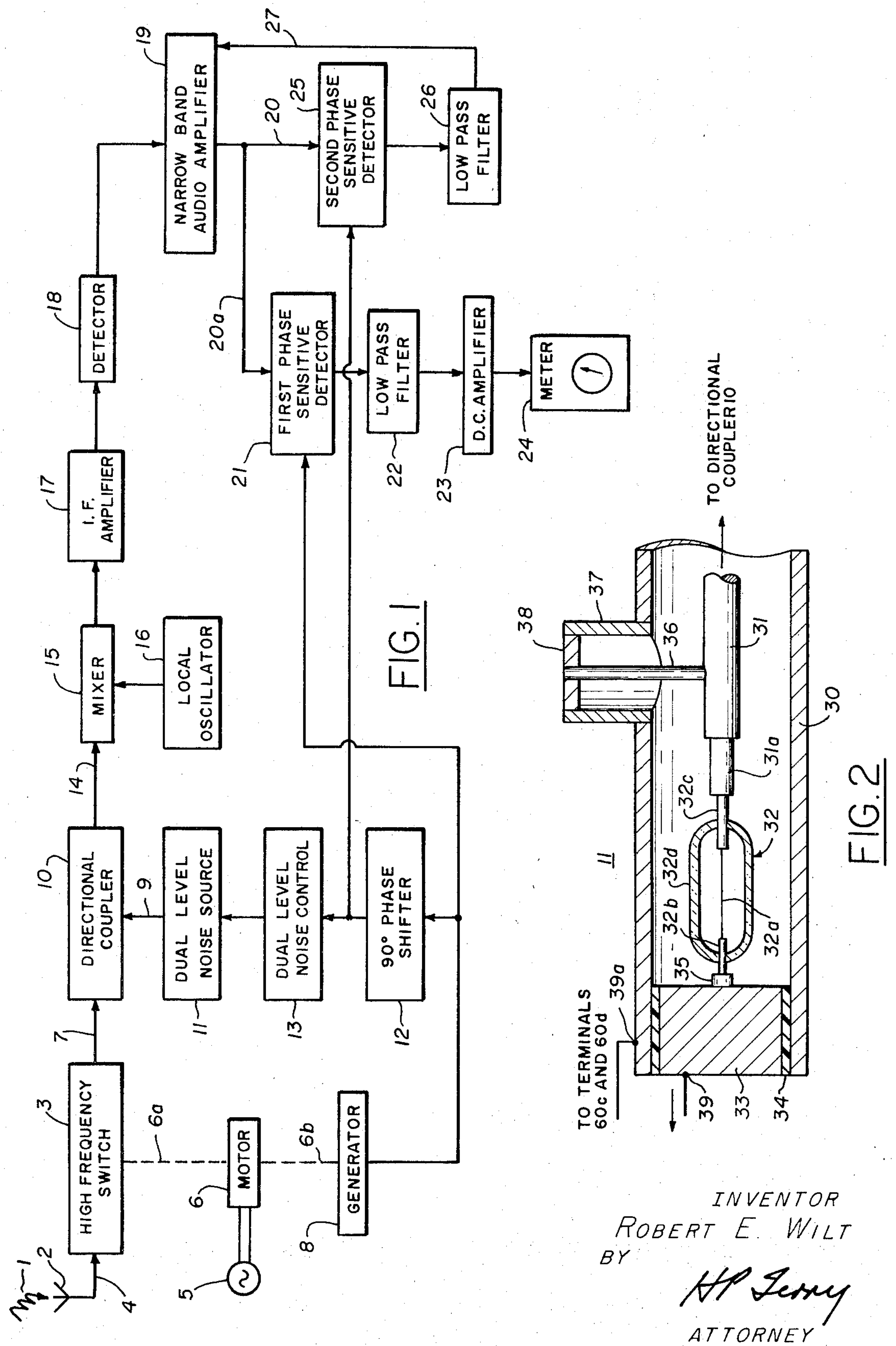
FIG. 1 is a block diagram of a preferred form of the invention.
FIG. 2 is a cross section view of an element of the apparatus shown in FIG. 1.

In FIG. 1, there is shown a block diagram of the novel radiometric system which, it will be seen, is useful over a wide spectrum of radio frequencies, and is of particular merit for use in the high frequency or microwave bands, including those of the ultra high frequency region and higher. It will be understood that the invention is useful, for example, in the type of radiometer known in the art as the comparison radiometer. In the comparison radiometer, the radiometer receiver is cyclically switched from a receiving antenna to a reference noise signal source.

The invention will be discussed herein in operation in a known type of comparison radiometer receiver in which an electronically actuated microwave switch first connects incoming signals collected by an antenna to the radiometer receiver, and then connects instead a temperature controlled microwave reference noise source to the radiometer receiver. Cyclic repetition of this switching process is conventionally employed in certain well known prior art radiometric concepts. For example, the invention is applicable in circumstances in which it is preferred to use the classical type of microwave comparison radiometer in which a noise reference element of known temperature is physically cyclically injected into and withdrawn from the transmission line joining the receiving antenna to the radiometer receiver.

In FIG. 1, signals 1 such as, for instance, low-power, noise-like radio frequency signals commonly associated with thermal radiation, generated by any source to be examined by the radiometer system, are received by an antenna 2 which may be any of various known types of broad band microwave or other antennas previously used in the radiometer art. Antenna 2 accepts signals falling within its pass band and supplies them to an input 4 of a high frequency switching device 3. As noted above, switching device 3 operates in a first state in such a manner that signals 1 are admitted to transmission line 7. Then, in a second state, a noise reference element is inserted within the transmission line structure of high frequency switch 3, and reference noise signals generated by it are propagated into transmission line 7. Cyclic repetition of the two states is conventional practice. Such high frequency radiometric switching and noise reference devices are well known in the art and have been used with success in the field for many years. An improved form of such a radiometric switch and reference device is a subject of the R.F.Riggs U.S. patent application Ser. No. 7,483, entitled "Radiometer System", filed Feb. 2, 1970, now U.S. Pat. No. 3,631,346, issued Dec. 28, 1971, and assigned to the Sperry Rand Corporation.

In FIG. 1, switch 3 is operated by electric motor 6 through mechanical linkage 6*a*, motor 6 being supplied with electricity from power source 5. Thus, motor 6 causes switch 3 cyclically and alternately to connect antenna 2 or the noise reference source within switch 3 to the input transmission line 7 and thus to the remaining elements of the radiometric receiver. Motor 6 also operates phase reference generator 8 by virtue of mechanical linkage 6*b*.

The input transmission line 7 supplies the cyclically varying high frequency signal propagating within it through directional coupler 10 (whose function remains to be discussed) to a conventional microwave mixer 15 via transmission line 14. A local oscillator 16, such as a semiconductor diode oscillator supplying high frequency signals in the usual manner to mixer 15, causes mixing of the two input signals, generating a modulated difference-frequency signal in the intermediate frequency spectrum for application to broad band intermediate frequency amplifier 17.

The output of intermediate frequency amplifier 17, when there is a cyclic difference in the levels of the signal propagating in transmission line 7, is an amplitude modulated signal, the modulation frequency being the switching repetition rate of switch 3. Envelope detector 18 is used in the conventional manner to recover this audio modulation, which may be of a frequency on the order of 100 cycles per second, from the intermediate frequency envelope, and to pass it through tuned or narrow band audio amplifier 19. Amplifier 19 has the center of its pass band coincident with the switching frequency of switch 8.

In order to determine the phase and amplitude difference of the cyclic signal propagating in line 7, a sinusoidal output of generator 8 in phase with the operation of switch 3 is supplied as a reference signal to one input of a first phase sensitive detector 21, a device employed in a conventional manner to detect the relative amplitudes of input signals and to evaluate which input signal has the greater amplitude.

As in conventional practice, the output of the first phase sensitive detector 21 is a polarity reversing direct voltage, which signal is subjected to the integrating action of a low pass filter 22, is amplified by d.c. amplifier 23, and is finally displayed, for instance, by a zero-center direct current meter 24. The adjustment of generator 8 and the phase of the reference signal generated by it relative to operation of switch 3 is such that, when signal 1 is equal in amplitude to the reference noise signal generated internally in switch 3, the meter needle points to zero, for instance, on the scale of meter 24. When signal 1 differs in amplitude with respect to the reference noise signal from switch 3, the needle is directed proportionally to one side or to the other of the zero indication of meter 24, for example.

As has been noted previously, the type of conventional comparison radiometer described above may have certain stability problems. Inherent in the comparison operation of the radiometer is relatively good short term gain stability, but the means which works to provide that short term gain stability is not always adequate for reducing or eliminating long term gain variations such as produced by drift in power supply voltages, changes in ambient temperature, aging of components, and the like. The problems associated with lack of gain stability in a microwave radiometer are better appreciated by realizing that the typical radiometer receiver must be a high gain device. It may have over all gain, even excluding the gain contribution of the antenna, of the order of 180 db. Since radiometer receivers are normally operated as linear power receivers, a total gain variation of only 0.5 db would generate as much as a 12 percent error in the receiver output. Such an error is found to be unacceptable in most applications, many of which need output stability on the order of 0.5 percent, corresponding to a gain variation no greater than 0.02 db. The apparatus now to be described achieves the desired gain stabilization by addition of a quadrature modulation signal path to the above-described system as a means of coupling a fixed gain control reference signal through the receiver system. The gain control reference signal is separated at the output of the receiver and provides a feed back signal to correct all undesired gain changes.

Referring again to FIG. 1, it is seen that the apparatus includes a second switching system for supplying noise signals into the receiver system through input transmission line 9 of directional coupler 10. The switching phase of this second switching system is controlled by the phase of the output of generator 8 as modified by 90 degree phase shifter 12. The phasing is such that the operation of the second switching system is in phase quadrature with the operation of switch 3.

The output of 90° phase shifter 12 is applied to dual level noise control 13. Control 13 modifies the sinusoidal wave form of generator 8 by forming a square wave signal whose nature will be further discussed with reference to FIG. 4. The square wave is applied to a dual-level noise source, contained within an extension of transmission line 9, for the cyclic generation of noise power at two different levels. The cyclic noise signals formed by dual level noise source 11 are cyclically switched at the frequency of switching of high frequency switch 3, but are in phase quadrature therewith.

A predetermined portion of the signal in transmission line 9 is coupled by directional coupler 10 into the output transmission line 14 along with the signal already appearing in transmission line 14 because of the operation of switch 3. Both signals are processed as would be expected, without ill effects because of their simultaneous presence, by local oscillator 16, mixer 15, intermediate amplifier 17, detector 18, and narrow band audio amplifier 19. For example, since narrow band amplifier 19 is peaked at the same frequency as the switching frequency of the high frequency switch 3 and of dual level noise source 11, quadrature displaced signals appear at the output of narrow band audio amplifier 19. These quadrature displaced signals are separated through the agency of the first phase sensitive detector 21, already discussed, and the second phase sensitive detector 25.

The output of the second phase detector 25 depends upon two inputs. A first input is fed by conductors 20 and 20*a* to both phase sensitive detectors 21 and 25. The second input to detector 25 is a reference signal supplied by generator 8, but phase shifted by 90 degrees because it flows through phase shifter 12. As a consequence of the demodulation action of phase sensitive detector 25, an output is produced whose amplitude is proportional to the difference in level of the noise signal cyclically generated by dual level noise source 11. The amplitude of the demodulated signal is also proportional to the gain of the receiver system, and any variations of the latter gain are reflected as changes in the output level of phase sensitive detector 25.

After subjection to the action of low pass filter 26, if desired, the output of the second phase sensitive detector 25 is supplied to an appropriate gain controllable stage of narrow band audio amplifier 19, where it is employed, in effect, to modify the over all gain of the receiver system in such a way as to correct for any undesired drift of the receiver gain. The gain control voltage on conductor 27 could also be applied in the well known manner to stages of the intermediate frequency amplifier 17 for the same corrective purpose. In some applications, it may be useful to supply the voltage on conductor 27 as a forward gain control voltage to d.c. amplifier 23, for instance.

In operation, high frequency radiometric signals collected by antenna 2 and reference signals pass through high frequency switch 3 to directional coupler 10. A reference signal for gain control purposes generated by dual level noise source 11 is added in directional coupler 10 to its output in transmission line 14. The first or radiometer switch 3 and the second or gain control switch system comprising the elements associated with source 11 operate at the same rate, being driven in common with generator 8 by motor 6, but in phase quadrature. The respective outputs of high frequency switch 3 and source 11 then flow through receiver elements including mixer 15, intermediate frequency amplifier 17, detector 18, and narrow band amplifier 19 to the output 20 of the latter.

Following audio amplifier 19, the signal bearing the true radiometric information and that bearing the quadrature signal developed for receiver gain control are separated by quadrature phased demodulators or phase sensitive detectors 21 and 25. The output of the first phase sensitive detector 21, which is the true radiometer signal demodulator, is a unidirectional signal whose amplitude is proportional to the difference of the temperature of the effective source viewed by antenna 2 and the reference temperature source within switch 3, as in standard comparison radiometer receivers. The output of the second phase sensitive detector 25, which serves as the gain control demodulator, is a signal whose amplitude is proportional to the constant differences between the two reference temperature levels generated by the dual level noise source 11 and is proportional also to the over-all gain of the radiometer receiver. This latter signal is used, as previously explained, to control the over-all gain of the radiometer receiver by applying it as a negative feed back voltage, for example, to a gain controllable stage of audio amplifier 19.

It has been observed that alternative choices are available for the high frequency switch 3 and for the reference noise signal source within switch 3. The preferred type of circuit employed for phase sensitive detectors 21 and 25 also depends upon the application of the radiometer system. In general, if the switching rate for high frequency switch 3 is to be high, conventional semiconductor demodulator circuits may be used in circuits 21 and 25. If the switching rate is low, then electromechanical phase detectors may be preferred in circuits 21 and 25, they being preferred on the grounds of simplicity and low cost.

Apparatus for generating the dual level noise signals required for operation of the automatic gain control arrangement of FIG. 1 will now be discussed with reference to FIGS. 2 to 6. For example, FIG. 2 illustrates a preferred form of the dual level noise source 11. While illustrated in the form of a coaxial transmission line device, it is understood that other known types of transmission line structures may be employed, such as hollow wave guide or strip transmission line. FIG. 2 represents apparatus 11 as employing a heated wire 32*a* as a source of modulatable broad band electromagnetic energy of relatively low, but precisely controllable noise power level located, for instance, in a coaxial transmission line composed of an outer conductor 30 enclosing an inner conductor 31. Inner conductor 31 may be supported in the conventional manner within conductor 30 by a branch or stub transmission line likewise composed of an inner conductor 36 positioned in an outer conductor 37 and supported therein by the short circuiting disc 38. At an end of line 30, 31, there is located a second disc 33 arranged as a short circuit only for high frequency currents by being insulated by an annular dielectric strip 34 from the inner conducting wall of outer conductor 30. The heated wire 32*a* is joined by pin 32*b* to a projection 35 located centrally on the inner face of disc 33. At its opposite end, heated or heatable wire 32*a* is joined by pin 32*c* to inner conductor 31 through impedance matching step 31*a*.

If it is desired that heated wire 32*a* operate in a special atmosphere or in a vacuum, pins 32*b* and 32*c* may form glass-to-metal seals with a suitable envelope, such as envelope 32*d*. Such a structure 32 is to be regarded as representative of those usable in the dual level noise source 11, because other heated wire structures may be substituted for structure 32.

It is seen that the small diameter wire 32*a* is mounted in such a manner as to couple electromagnetic noise energy generated by it, when heated by an electrical current, to transmission line 30,31 and thus to directional coupler 10 and to the radiometer receiver. Various types of metallic or other materials may be used for constructing wire 32*a*, such as platinum or tungsten. Such wires, having diameters on the order of $15 \times 10^{-5}$ centimeters, for example, are readily made by chemical etching of the type of wire known on the market as Wollaston wire. For generating a desired temperature and noise power level, the length and diameter or equivalent dimensions of wire or conductor 32*a* are selected so that the wire 32*a*, when properly mounted and heated to the desired temperature, presents a characteristic impedance substantially equal to the characteristic impedance of the transmission line 30, 31.

However, a perfect impedance match is not required. In general, the selected parametric relations are such that the wire 32a as a modulated noise source has the same impedance mismatch for both of its selected temperature levels of operation. For example, if a platinum wire is used as wire 32a and is impedance matched to line 30,31 at 533° K, and the current through wire 32*a* is then amplitude modulated in such a manner as to vary the temperature from 373° to 773° K, then the noise power emissivity at both temperature levels will be about 0.823 and the difference in the effective radiated temperature will be 0.823 (773°–373°) = 329° K. The fact that there is some impedance mismatch at both temperature levels is thus not of great importance.

Figures 3, 4, 5, 6:
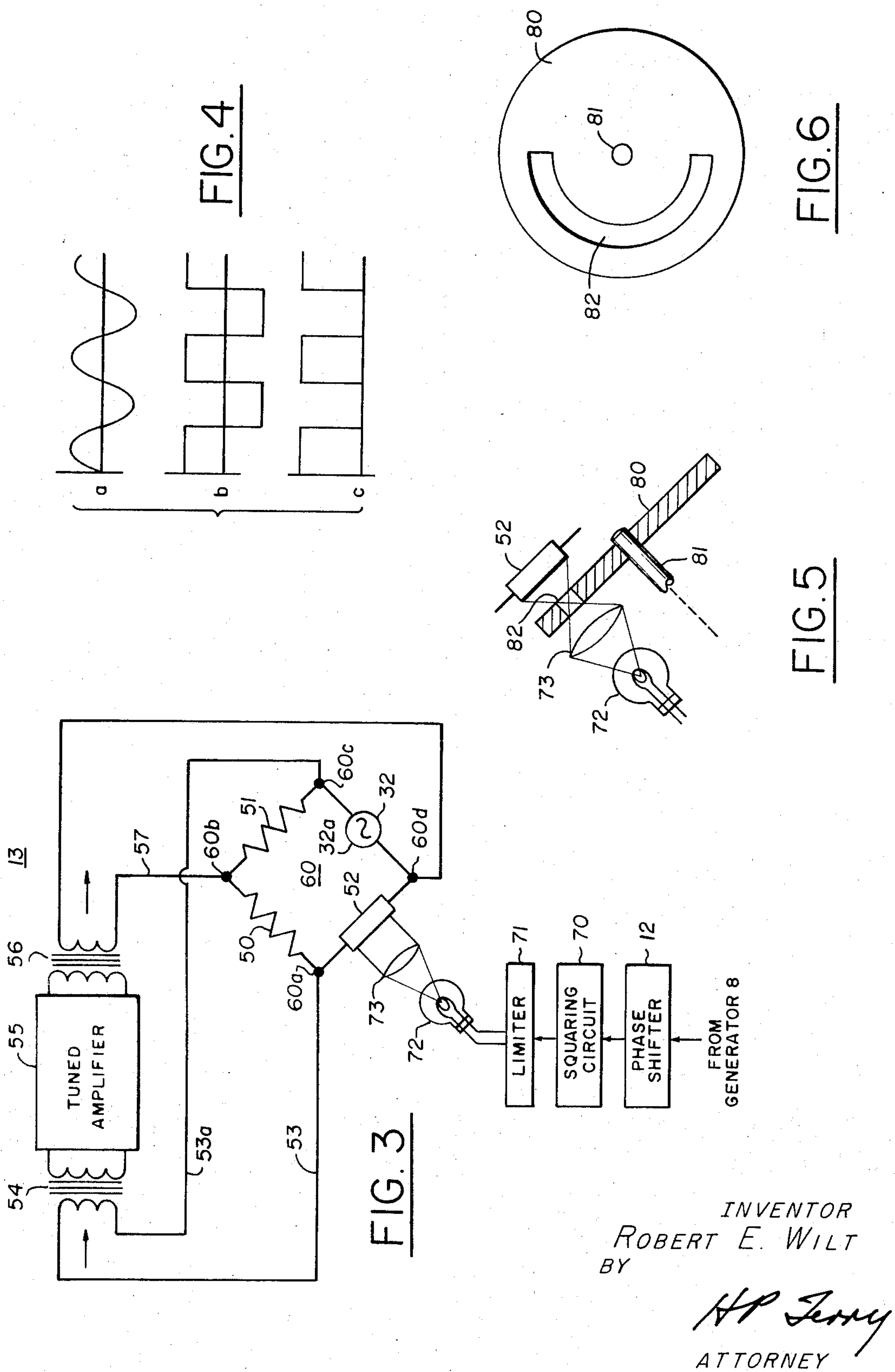
FIG. 3 is a wiring diagram of a circuit for use with the apparatus of FIG. 2.
FIG. 4 contains graphs useful in explaining the operation of the apparatus of FIG. 3.
FIG. 5 is a view, partly in cross section, of a mechanical system which may be substituted for part of the circuit of FIG. 3.
FIG. 6 is a front view of an element of FIG. 5.

FIG. 3 illustrates details of the dual level noise control 13 of FIG. 1 for controlling the temperature of wire 32*a* of the dual level noise source 11. An essential part of control 13 is a bridge 60 having four arms and four terminals 60*a*, 60*b*, 60*c*, and 60*d*. Two arms of bridge 60 may be composed of stable fixed resistors 50 and 51. A third arm of bridge 60 is the heated or heatable wire 32 of dual level noise source 11, while a fourth is a light-sensitive resistor 52 of the type whose resistance varies as a function of the intensity of light illuminating it. Other types of semiconductor and other current level control means may be substituted for photoresistor 52 in bridge 60.

Power is supplied to terminals 60*b* and 60*d* of bridge 60 via respective conductive leads 57 and 57*a* from step-down transformer 56 at the output of tuned audio amplifier 55. An audio error signal representing a measure of any unbalance of bridge 60 is derived from terminals 60*a*, 60*c* and is supplied by the respective leads 53, 53*a* to step-up transformer 54 at the input of tuned amplifier 55. When the system is first tuned on, wire 32a is cold, bridge 60 is unbalanced, and a considerable feed back current flows via leads 53, 53*a* through amplifier 55 and to bridge terminals 60*b*, 60*d*. Oscillation results because of the feedback path through tuned amplifier 55 and audio frequency power is supplied to bridge 60 and to wire 32*a*, heating the latter. As wire 32*a* is rapidly heated, its resistance rapidly increases because of the nature of the material of which it is composed and bridge 60 becomes substantially balanced.

Amplifier 55 is made sharply frequency selective so that the circuit oscillates stably and only at a predetermined frequency. The selected audio frequency is high with respect to that of the switching of high frequency switch 3; further, the selected frequency is high enough so that the resistance of wire 32*a* is substantially constant during one cycle of the selected frequency. It is seen that when the resistivity of photoresistor 52 is cyclically shifted between two valves, the circuit associated with bridge 60 automatically follows the stepped shifting of that resistance by re-adjusting the resistance and therefore the temperature and level of noise emission of heated wire 32*a*. Cyclic modulation of resistor 52 therefore causes precise and cyclic modulation of the noise signal supplied to the radiometric system via directional coupler 10.

Cyclic modulation of photoresistor 52 is caused by the dual level noise control which may consist of the squaring circuit 70, the limiter 71, and lamp 72 of FIG. 3. Referring also to FIG. 4, the sinusoidal output signal (curve *a* of FIG. 4) obtained from 90° phase shifter 12 is supplied to a conventional squaring circuit 70, producing the square wave *b* of FIG. 4. In one form of the invention, only the positive going portions of wave *b* are used. For this purpose, wave *b* is passed through a suitable limiter 71 or other circuit for producing the pulse train of wave c of FIG. 4. For operation at two temperature levels, an alternative circuit simply adding in a known manner a d.c. amplitude off-set to the wave *b* of FIG. 4 may also be used. The signal output of limiter 71 is applied to a lamp 72 and the modulated light generated by it is focused by lens 73 on a photoactive face of resistor 52, thus modulating the resistance of photo-sensitive device 52, as above-described.

Other means may be used for modulating the light beam illuminating resistor 52, as seen in FIGS. 5 and 6.

Lamp 72 in FIG. 6 is continuously illuminated and its output is focused on the sensitive face of photoresistor 52. The light beam is chopped by an optical disc or rotary shutter 80 interposed between lens 73 and resistor 52. As seen more clearly in FIG. 6, disc or optical shutter 80 is supplied in one form with an arcuate open sector 82 of 180° angular extent. Driven by shaft 81 linked directly to motor 6 in quadrature with the operation of high frequency switch 3, rotating disc 80 effects the modulation of the output of dual level noise source 11 in effectively the same manner as the circuit of FIG. 3. Disc 80 may be provided with an open 360° sector, 180° of which is fully transparent and 180° of which has a lesser transparency.

It will be readily apparent to those skilled in the radiometer art that the above-described novel heated-wire noise-generator system may be adapted directly for performing the function of the primary noise reference generator contained within switch 3; i.e., antenna 2 may be coupled as one input to a first port of a conventional high frequency signal switch, such as a latching ferrite switch, and the apparatus of FIG. 2 may be coupled to a second input port of the substituted switch. thus, the received antenna signals 1 and a stable reference signal from the novel heated wire device may be alternately and cyclically applied to mixer 15 of the radiometric receiver for primary comparison purposes. Accordingly, one advantage of the invention lies in the fact that similar heated wire reference devices and controls may be used to supply the primary comparison reference noise signals, thus yielding the greater economy and reliability which is normally achieved when multiple similar parts are used.

The novel heated wire noise source is smaller than prior radiometric noise sources except the semiconductor noise diode. While semiconductor noise diodes are capable of higher noise output, their output is somewhat dependent upon ambient temperature, and there is no directly measurable diode parameter which can be used to determine or control its noise output as is present in the heated wire source. The heated wire noise source is much smaller and consumes much less power than conventional heated, temperature controlled transmission line terminations. While such terminations have been built for use at temperatures about as high as that obtainable from hot wires, such terminations consume large amounts of power and suffer from serious difficulties in isolating the heat from attached transmission line elements and in determining the actual radiated temperature of the termination. High frequency modulation of the temperature of such terminations is obviously impractical. The heated wire source is useful at frequencies far above those at which the temperature limited thermionic vacuum diode may be used. The vacuum diode is useful at a maximum frequency of only a few gigacycles.

The prior device of most general use at microwave frequencies is the gas discharge noise diode which has more desirable features than other of the prior devices described. It is capable of generating noise temperatures to approximately 19,000° K., it can be used to at least 75 GHz, it has stable output as long as the discharge current is closely controlled, and some designs can be turned on and off at relatively rapid rates. Compared to the hot wire noise source, it has very serious deficiencies: it is large and often heavy, the glass tube is quite fragile, it requires high voltages and fairly high currents for operation, it is quite expensive, it consumes large amounts of power which must be dissipated as heat, and plasma oscillations are a frequent problem. None of these problems is present in the simple heated wire device of the present invention.

It will be observed that the invention has many advantages over prior art solutions to the radiometer gain control or calibration problem, as enumerated above. Furthermore, continuous gain control action is provided simultaneously with radiometer signal measurement, gain regulation being provided in the portion of the signal spectrum where it is really wanted; e.g., at the primary switching frequency. The radiometer signal spectrum and the gain control switch spectrum are identical, since both high frequency switches operate at the same switching frequency.

While the invention has been described in its preferred embodiments, it is to be understood that the words which have been used are words of description rather than of limitation and that changes within the purview of the appended claims may be made without departure from the true scope and spirit of the invention in its broader aspects.

I claim:

1. In transmission line apparatus for generating broad band noise signals:

transmission line means capable of supporting an electromagnetic field therein, heatable fine wire resistor means in energy exchanging relation with said transmission line means for excitation of said electromagnetic field, bridge means having plural arms and including said wire resistor means in a first arm thereof, photo-sensitive means in a second arm of said bridge means, tuned amplifier means responsive to unbalance of said bridge for automatically balancing said bridge, and means for controlling the resistivity characteristic of said photo-sensitive means.

2. Apparatus as described in claim 1 wherein:

said bridge means has first and second opposed pairs of terminal means, said first pair of terminal means being connected through said heatable fine wire resistor means and said photosensitive means in series relation.

3. Apparatus as described in claim 2 wherein:

said first pair of opposed terminal means is connected to the input of said tuned amplifier means for supplying a bridge unbalance signal to said amplifier.

4. Apparatus as described in claim 3 wherein:

said second pair of opposed terminal means is connected to the output of said tuned amplifier means for the purpose of supplying bridge balancing power to said bridge means.

5. Apparatus as described in claim 1 comprising:

means for generating light for controlling said resistivity characteristic of said photo-sensitive means, and means for supplying a square wave electrical signal for modulating said light.

6. Apparatus as described in claim 5 wherein said photo-sensitive means comprises a photo-sensitive resistor.

7. Apparatus as described in claim 1 comprising:
means for generating light,
optical shutter means, and
motive means for cyclically operating said shutter means for controlling said photo-sensitive device.

8. Radiometer receiver means comprising:
unitary gain control, dual output-level, noise reference signal generator means,
variable gain amplifier means in series circuit within said radiometer receiver means and responsive to said noise reference signal generator means,
control means for cyclically switching said noise reference signal generator means between first and second output levels,
synchronous demodulator means responsive to said variable gain amplifier means,
said synchronous demodulator means being controlled by said control means for cyclically demodulating the envelope of the output of said variable gain amplifier means for generating a unidirectional gain control signal for continuously controlling the gain of said variable gain amplifier means thereby continuously controlling the gain of said radiometer receiver.

9. Apparatus as described in claim 8, wherein said unitary noise reference signal generator means comprises:
transmission line means coupled to said variable gain amplifier means,
heatable resistor means in electromagnetic energy exchanging relation with said transmission line means,
multi-arm bridge means including said heatable resistor means in a first arm thereof,
means having a square wave modulatable characteristic in a second arm of said bridge means,
means for modulating said modulatable characteristic, and
means for automatically balancing said multi-arm bridge means in response to said modulation.

10. Apparatus as described in claim 9 wherein said means for automatically balancing said multi-arm bridge means comprises:
first and second opposed pairs of opposed terminal means in said bridge means,
tuned amplifier means,
means connecting said first opposed pair of terminal means to the input of said tuned amplifier means, and
means connecting said second opposed pair of terminal means to the output of said tuned amplifier means.

11. Apparatus as described in claim 10 wherein a photo-sensitive resistor device is coupled in an arm of said bridge means in series relation with said heatable resistor means.

12. Apparatus as described in claim 11 comprising means for modulating a characteristic of said photo-sensitive resistor device for the purpose of modulating the amplitude of current passing through said heatable resistor means.

13. In radiometric receiver means of the comparison type comprising in series relation input means for cyclically switching between first and reference noise signal source means, variable gain amplifier means responsive to said input means, and output means responsive to said variable gain amplifier means for synchronously demodulating the envelope of said cyclically switched signal for comparison purposes, gain control means comprising:
switchable unitary gain control dual-level, noise source means,
control means for switching said gain control dual-level noise-source means in phase quadrature with respect to said cyclically switched input means for producing cyclic dual-level noise signals,
means for coupling said cyclic, dual-level noise signals to said variable gain amplifier means,
means for synchronously demodulating the envelope of said cyclic, dual-level noise signals for the purpose of generating a unidirectional gain control signal, and
means for supplying said unidirectional gain control signal to said variable gain amplifier means for gain control purposes.

* * * * *